United States Patent [19]

Sakai et al.

[11] Patent Number: 4,847,169

[45] Date of Patent: Jul. 11, 1989

[54] ALLOYED-ZINC-PLATED STEEL SHEET AND PROCESS FOR PREPARING THE SAME

[75] Inventors: Nobuhiko Sakai; Yukio Uchida, both of Hyogo; Eizo Wada; Yusuke Hirose, both of Osaka, all of Japan

[73] Assignee: Nisshin Steel Company, Ltd., Tokyo, Japan

[21] Appl. No.: 139,019

[22] Filed: Dec. 29, 1987

[51] Int. Cl.$^4$ .............................................. B32B 15/18
[52] U.S. Cl. .................... 428/659; 427/251; 427/383.7
[58] Field of Search ............... 428/659; 427/250, 251, 427/383.7; 148/6.35

[56] References Cited

U.S. PATENT DOCUMENTS 4,676,999  6/1987  Furukawa et al. ................. 427/250

FOREIGN PATENT DOCUMENTS 185966  11/1982  Japan ............................. 427/383.7

*Primary Examiner*—Robert McDowell
*Attorney, Agent, or Firm*—Webb, Burden, Ziesenheim & Webb

[57] ABSTRACT

Alloyed-zinc-plated steel sheet the alloyed layer of which is minutely cellulated is disclosed. Such an alloyed-zinc-plated steel sheet can be prepared by carrying out the vacuum deposition plating in an inert atmosphere containing 1.0–30 ppm oxygen by volume oxygen and subjecting the plated steel sheet to an alloying heat treatment.

4 Claims, 2 Drawing Sheets

× 2000

ELECTRON MICROGRAPH OF THE PRODUCT OF THE WORKING EXAMPLE (Fe-Zn ALLOY LAYER) (WEAKLY DEOXIDIZED STEEL BASE, $O_2$:10 ppm)

× 2000

ELECTRON MICROGRAPH OF THE PRODUCT OF THE COMPARATIVE EXAMPLE (Fe-Zn ALLOY LAYER) (WEAKLY DEOXIDIZED STEEL BASE, $O_2$:0.1ppm)

ALLOYED-ZINC-PLATED STEEL SHEET AND PROCESS FOR PREPARING THE SAME

FIELD OF THE INVENTION

This invention relates to alloyed-zinc-plated steel sheet and a process for preparing the same.

BACKGROUND OF THE INVENTION

Alloyed-zinc-plated steel sheets exel ordinary zinc-plated steel sheets in continuous operability in spot welding, in adhesion of electrodeposited coating films and in corrosion resistance. Therefore, they are extensively used in the automobile industry and a wide range of other industries.

Although alloyed zinc-plated-steel sheets are excellent as mentioned above in adhesion of coating films and weldability in spot welding, they are generally inferior in workability because of the brittleness of intermetallic compounds formed in the alloyed layer. In particular, alloyed-zinc-plated steel sheets manufactured by the conventional hot-dip plating and electroplating are found to suffer marked powdering as the coating weight and the Fe content in the alloy layer increase.

Meanwhile, continuous vacuum vapor deposition zinc plating has now come into practical use in addition to the conventional hot-dip plating and electroplating, and manufacture of alloyed metal-plated steel sheets by the vacuum vapor deposition process is also being attempted. The continuous vacuum vapor deposition plating process is especially superior to the conventional hot-dip plating and electroplating in that it enables easy high speed manufacture of plated sheets, both single-side plated and double-sized plated sheets with plating thickness ranging from thin to thick or different thicknesses double-side plated sheets.

We have found that if vacuum vapor deposition Zn plating is carried out in an atmosphere containing oxygen controlled to a prescribed level, the alloyed layer is minutely cellulated whereby powdering of the resulting alloyed layer is largely prevented.

DISCLOSURE OF THE INVENTION

This invention provides an alloyed-zinc-plated steel sheet the alloyed layer of which is minutely cellulated.

This invention also provides a process for preparing alloyed-zinc-plated steel sheet comprising carrying out vacuum vapor deposition zinc plating of steel sheet in an inert atmosphere containing 1.0–30 ppm by volume of oxygen and subjecting the plated steel sheet to an alloying heat treatment.

In the present invention, the term "alloyed layer" means an Zn-Fe alloy layer which substantially intermetallic compounds.

"Cellulation" means that the alloyed layer consists of minutely distributed well-grown grains of Fe-Zn intermetallic compounds (mainly $\delta_1$ phase), of which the size is $10^4$–$10^6$ grains per 1 mm$^2$.

In the procees of the present invention, the vacuum vapor deposition of zinc plating on steel sheet can be carried out using a known vacuum vapor deposition plating apparatus.

When the vacuum vapor deposition zinc plating is effected in said atmosphere containing oxygen maintained at the above defined level and the zinc-plated steel sheets are subjected to alloying heat-treatment, the alloyed layer is minutely cellulated. The reason for the cellulation is not entirely clear, but it is surmized that a slight amount of oxygen present in the atmosphere in which vapor deposition is effected forms minutely distributed extremely thin oxide on the surface of the steel sheet prior to deposition of zinc vapor, and thus the zinc vapor desposits over such distributed oxide. Therefore, such minutely distributed oxide work as barriers and locally prevent the mutual diffusion of Fe and Zn, and cellulate the formed Fe-Zn intermetallic compounds.

If the oxygen concentration of the atmosphere is less than 1.0 ppm, the alloyed layer is not satisfactorily cellulated and therefore, the powdering prevention effect is not sufficient. If the oxygen concentration is in excess of 30 ppm, the formed oxide are excessive and the adhesion of the plated layer is impaired. More preferred oxygen concentration is 1.5–15 ppm.

Vapor deposition and alloying treatment per se are established techniques. Alloying treatment can be carried out by means of a conventional heating furnace such as installed in a conventional hot-dip plating line or by means of a batch type heating furnace.

The preferred temperature of steel strip immediately before the vapor deposition is between 190° C. and 280° C.

The preferred alloying treatment temperature is 220° C.–360° C.

The preferred size of the grains (the so-called cells) of the Fe-Zn intermetallic compounds is $10^4$–$10^6$ particles per mm$^2$.

The alloyed-zinc-plated steel sheet of the present invention, of which the alloyed layer in minutely cellulated, has excellent workability. Because the alloyed layer is minutely cellulated and thus the stress generated in the alloyed layer when it is worked is relieved through the borders or voids between the minute grains, and therefore the occurrence of powdering of the alloyed layer is largely prevented.

The process of the present invention makes use of vacuum vapor deposition. Thus it enables enjoyment of the advantages of vacuum vapor deposition. That is, it permits manufacture of the alloyed-zinc-plated steel sheets with plating thicknesses ranging from thin to thick or with differential thickness either single-side plated or double-side plated. Thus alloyed-zinc-plated steel sheets provided with excellent workability and powdering resistance can be easily manufactured.

BRIEF EXPLANATION OF ATTACHED DRAWINGS

SPECIFIC DISCLOSURE OF THE INVENTION

Figure 1:
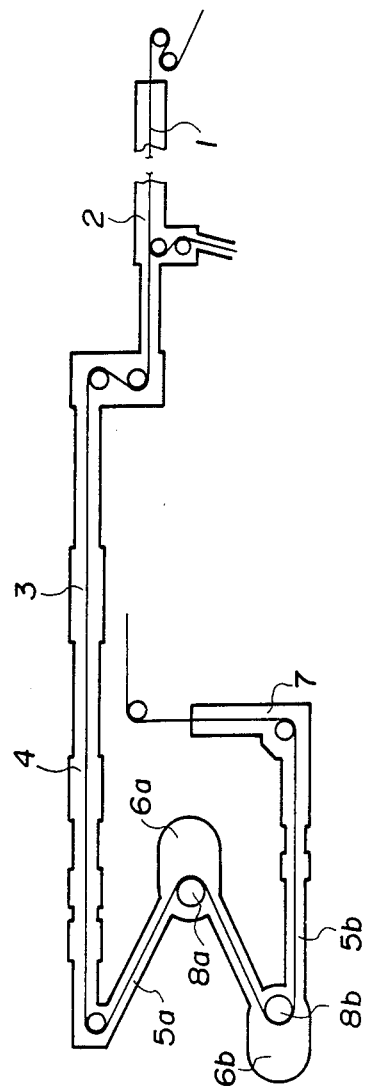
FIG. 1 is a schematic representation of a continuous vacuum vapor deposition plating apparatus, which can be employed in working of the process of the present invention.

Several types of continuous vacuum vapor deposition plating apparatus have been proposed up to now. One example is illustrated in FIG. 1. Such an apparatus is disclosed in Nisshin Giho No. 51 for instance. The apparatus shown there is provided with two deposition chambers for carrying out double-side plating. Only one chamber suffices for single-side plating.

The vapor deposition line comprises a pretreatment furnace 2, a gas jet cooler 3, a pressurizable chamber 4, first and second sealing roller chambers 5a, 5b, a first vapor deposition chamber 6a, a second vapor deposition chamber 6b, a cooling chamber 7, wherein the plated steel sheet is cooled, and a heating furnace for alloying (not shown). In the vacuum vapor deposition chambers 6a, 6b, guide rollers 8a, 8b and a zinc-vaporizing bath (not shown) are provided. A steel strip 1 passes through this vapor deposition line.

The pretreatment furnace 1 has a slightly oxidizing and/or reducing atmosphere of ambient pressure. The surface of the steel strip is cleaned when it passes through the furnace.

The gas jet cooler 3 cools the pretreated steel strip to the temperature desired for vapor deposition.

The pressurizable chamber 4 connects the ambient pressure system including the pretreatment furnace 2, the gas jet cooler 3, etc. and the evacuated system including the sealing roller chambers 5a, 5b, the vapor deposition chambers 6a, 6b, etc.

The sealing roller chamber comprises a plurality of vacuum chambers, each provided with a pair of sealing rollers and evacuated until the pressure of 0.01–0.1 Torr. in the vapor deposition chamber.

The pressurizable chamber 4 is pressurized by an inert gas such as nitrogen to a pressure slightly higher than the pressure of the ambient pressure system in order to prevent introduction of air or air and hydrogen, which might cause explosion, into the vacuum vapor deposition chamber or chambers.

The oxygen concentration in the atmosphere wherein vacuum deposition is effected is controlled by mixing a prescribed amount of oxygen into the pressurizable chamber.

The invention will now be illustrated by way of working and comparative examples.

Continuous vacuum vapor deposition zinc plating was carried out using an apparatus which is substantially as illustrated in FIG. 1 under the conditions indicated in Table 1. The total length of the plating line was 70 m. The alloying heat treatment was carried out using a separate batch type furnace.

TABLE 1

| | |
|---|---|
| Steel strip used: | 0.6 mm thick × 300 mm wide plain carbon steel |
| Line speed: | 15 m/min. |
| Temp. of steel sheet immediately before plating: | 190–280° C. |
| Temperature of Zn bath: | 460–470° C. |
| Coating weight: | 45–50 g/m² per side |
| Evacuation in vapor deposition chamber: | 0.01–0.1 Torr. |

TABLE 1-continued

| | |
|---|---|
| Alloying conditions: | 280° C. × 5 hrs. |

TABLE 2

| Example No. | O₂ conc. in vapor Deposition Chamber | Property of Alloyed Layer |
|---|---|---|
| Ex. 1 | 1.0 ppm | No powdering occurs |
| 2 | 3.0 ppm | " |
| 3 | 10.0 ppm | " |
| 4 | 20.0 ppm | " |
| 5 | 30.0 ppm | " |
| Comparative Ex. | | |
| 1 | 0.05 ppm | Powdering occurs |
| 2 | 0.1 ppm | " |
| 3 | 40.0 ppm | Plated layer peels off |

Powdering resistance was judged by occurrence of powdering when plated specimen were bent at the angle of 180° with a clearance of six times the thickness of the test piece and brought back, a cellophone adhesive tape was applied to the portion, which was bent and brought back, and removed. Occurrence of peeling of the plated layer was observed.

Figure 2:
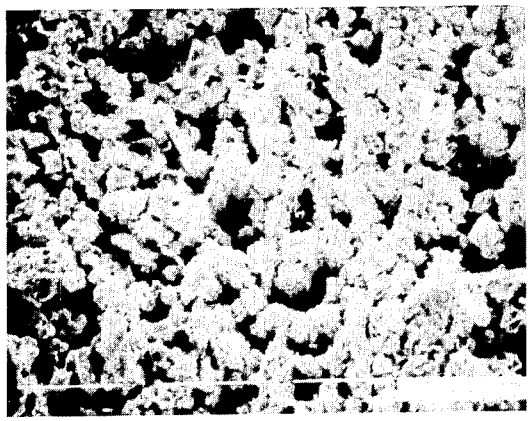
FIGS. 2 and 3 are an electron micrographs showing the structure of the alloyed layer of an alloyed-zinc-plated steel sheet of an Example and a Comparative Example, respectively.

By the alloying treatment, the plated layer became an alloy up to the surface. FIG. 2 is an electron micrograph of the surface of the product of Working Example 3 and FIG. 3 is an electron micrograph of the product of Comparative Example 2.

Figure 3:

As seen there, in FIG. 2, isolated crystals, i.e. cells are well developed, while in FIG. 3, the alloyed layer is smoother.

We claim:

1. An alloyed-zinc-plated steel sheet having an alloyed layer of Fe-Zn intermetallic compounds which is minutely cellulated into grains having a size of between about $10^4$–$10^6$ grains per mm².

2. A process for preparing alloyed-zinc-plated steel sheet comprising carrying out vacuum vapor deposition zinc plating of steel sheet in a substantially hydrogen free inert atmosphere containing 1.0–30 ppm by volume of oxygen, subjecting the plated steel sheet to an alloying heat treatment and therein forming a Fe-Zn alloy layer of substantially intermetallic compounds.

3. The process for preparing alloyed-zinc-plated steel sheet of claim 2, wherein the oxygen content of the vacuum deposition atmosphere is 1.5–15 ppm.

4. The process for preparing alloyed-zinc-plated steel sheet of claim 2, wherein the alloying heat treatment is conducted at a temperature between about 220° C. and 360° C.

* * * * *

UNITED STATES PATENT AND TRADEMARK OFFICE
CERTIFICATE OF CORRECTION

PATENT NO. : 4,847,169

DATED : July 11, 1989

INVENTOR(S) : Nobuhiko Sakai, Yukio Uchida, Eizo Wada and Yusuke Hirose

It is certified that error appears in the above-identified patent and that said Letters Patent is hereby corrected as shown below:

Column 1 Line 10 "exel" should read --excel--.

Column 1 Line 34 "double-sized" should read --double-side--.

Column 3 Line 33 after "the" insert --inert gas, nitrogen for instance, to be introduced, into the--.

Signed and Sealed this

Fifteenth Day of May, 1990

Attest:

HARRY F. MANBECK, JR.

*Attesting Officer*     *Commissioner of Patents and Trademarks*